(12) United States Patent
Kobayashi

(10) Patent No.: US 11,276,597 B2
(45) Date of Patent: Mar. 15, 2022

(54) TRANSPORT VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 226 days.

(21) Appl. No.: 16/774,121

(22) Filed: Jan. 28, 2020

(65) Prior Publication Data

US 2020/0269882 A1 Aug. 27, 2020

(30) Foreign Application Priority Data

Feb. 27, 2019 (JP) .............................. JP2019-033907

(51) Int. Cl.
*B61B 3/00* (2006.01)
*H01L 21/677* (2006.01)
*B61B 12/00* (2006.01)
*B65G 1/04* (2006.01)
*H01L 21/687* (2006.01)

(52) U.S. Cl.
CPC .......... *H01L 21/67733* (2013.01); *B61B 3/00* (2013.01); *B61B 12/00* (2013.01); *B65G 1/0457* (2013.01); *H01L 21/6773* (2013.01); *H01L 21/67706* (2013.01); *H01L 21/67724* (2013.01); *H01L 21/68707* (2013.01)

(58) Field of Classification Search
CPC ........... H01L 21/67733; H01L 21/6773; H01L 21/67724; H01L 21/68707; H01L 21/67706; B61B 3/00; B61B 3/02; B61B 12/00; B65G 1/0457; B65G 35/06

See application file for complete search history.

(56) References Cited

U.S. PATENT DOCUMENTS

| | | | | |
|---|---|---|---|---|
| 5,165,556 A | * | 11/1992 | Karhunen | ............... B66C 13/06 212/105 |
| 7,210,589 B2 | * | 5/2007 | Iizuka | ....................... B66C 1/28 212/273 |
| 8,757,401 B2 | * | 6/2014 | Uchino | ............. H01L 21/67733 212/77 |
| 2006/0237525 A1 | * | 10/2006 | Sone | ................. H01L 21/67733 235/375 |
| 2008/0092769 A1 | * | 4/2008 | Izumi | ................ H01L 21/68707 105/148 |
| 2011/0062103 A1 | * | 3/2011 | Honda | ............. H01L 21/67736 212/71 |

(Continued)

FOREIGN PATENT DOCUMENTS

JP 2017-88332 A 5/2017

*Primary Examiner* — Zachary L Kuhfuss
(74) *Attorney, Agent, or Firm* — Keating & Bennett, LLP

(57) ABSTRACT

An overhead transport vehicle includes a fall prevention mechanism including a first rotary member, a fall prevention member, and a second rotary member. The first rotary member includes a base end portion supported so as to be rotatable about a first rotation shaft extending along direction Y. The fall prevention member is provided in a tip end portion of the first rotary member and is movable to a space below a cassette. The second rotary member includes a base end portion supported so as to be rotatable about a second rotation shaft extending along direction Z, and a tip end portion to which the first rotary member is attached.

5 Claims, 17 Drawing Sheets

(56) References Cited

U.S. PATENT DOCUMENTS

| | | | |
|---|---|---|---|
| 2013/0213257 A1* | 8/2013 | Yamamoto | H01L 21/6773 105/150 |
| 2014/0047995 A1* | 2/2014 | Kobayashi | B61B 3/00 104/89 |
| 2017/0323817 A1* | 11/2017 | Kobayashi | H01L 21/67706 |
| 2019/0241406 A1* | 8/2019 | Kobayashi | B66C 19/00 |
| 2020/0223455 A1* | 7/2020 | Kobayashi | H01L 21/67724 |
| 2020/0331503 A1* | 10/2020 | Kobayashi | H01L 21/6773 |
| 2020/0339162 A1* | 10/2020 | Kobayashi | B66C 11/06 |

* cited by examiner

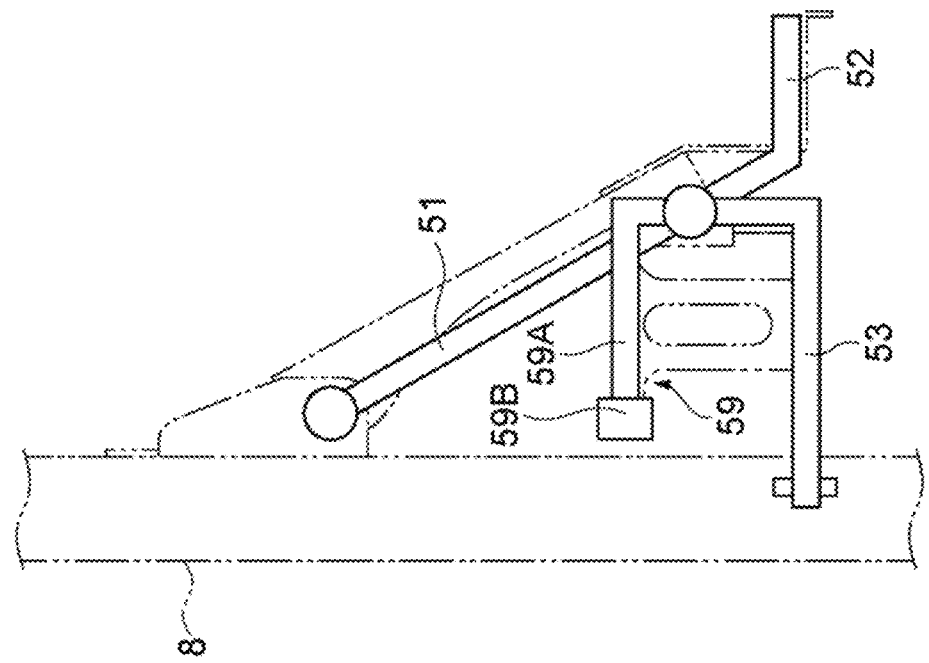
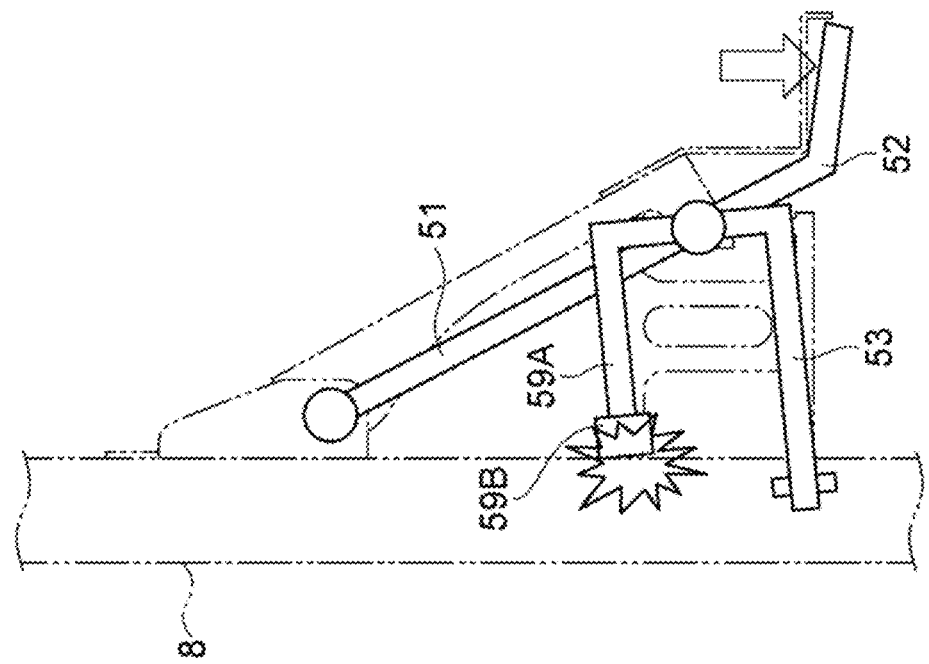

TRANSPORT VEHICLE

CROSS REFERENCE TO RELATED APPLICATIONS

This application claims the benefit of priority to Japanese Patent Application No. 2019-033907 filed on Feb. 27, 2019. The entire contents of this application are hereby incorporated herein by reference.

BACKGROUND OF THE INVENTION

1. Field of the Invention

The present invention relates to a transport vehicle.

2. Description of the Related Art

As a technology related to a transport vehicle, an overhead transport vehicle that travels in a position near a ceiling or higher than a floor surface of a clean room or the like and transports a container (transport object) containing a semiconductor wafer, a reticle, a liquid crystal substrate, or the like has been known. For example, JP 2017-88332 A discloses an overhead transport vehicle including a horizontally swiveling fall prevention device (fall prevention mechanism) that prevents falling of an FOUP.

In the transport vehicle as described above, when a transport object such as a heavy object is transported, for example, the fall prevention mechanism may not be strong enough to reliably prevent falling of the transport object. Additionally a simple configuration is desired for the transport vehicle as described above.

SUMMARY OF THE INVENTION

Preferred embodiments of the present invention provide transport vehicles that each reliably prevent falling of a transport object with a simple configuration.

A transport vehicle according to a preferred embodiment of the present invention is a transport vehicle that transports a transport object, the transport vehicle including a fall prevention mechanism that prevents falling of the transport object. The fall prevention mechanism includes a first rotary member including a base end portion supported so as to be rotatable about a first rotation shaft extending along the horizontal direction, a fall prevention member provided on a tip end portion of the first rotary member and capable of advancing to a space below the transport object, and a second rotary member including a base end portion supported so as to be rotatable about a second rotation shaft extending along the vertical direction, and a tip end portion to which the first rotary member is attached.

In the transport vehicle, the fall prevention member can be supported by a truss structure including the first rotary member and the second rotary member, and the strength of the fall prevention mechanism is thus increased efficiently. Hence, even when a transport object such as a heavy object is transported, for example, it is possible to reliably prevent falling of the transport object with a simple configuration.

In a transport vehicle according to a preferred embodiment of the present invention, the fall prevention mechanism may include a stopper provided on the second rotary member, the first rotary member may rotate between a first state and a second state in which the tip end portion of the first rotary member is lifted higher than in the first state, the fall prevention member may advance to a space below the transport object in the second state, and the stopper may restrict rotation of the first rotary member when a force is applied to the first rotary member in the second state. In this configuration, even when a force is applied to the first rotary member in a state where the fall prevention member is advanced below the transport object, it is possible to reduce or prevent distortion of the fall prevention mechanism. This makes it possible to prevent falling of the transport object more reliably.

In a transport vehicle according to a preferred embodiment of the present invention, the first rotary member may include a horizontal shaft extending along the axial direction of the first rotating shaft, the tip end portion of the second rotary member may include a vertical shaft, and a slide member attached to the vertical shaft so as to be slidable along the axial direction of the vertical shaft, and the slide member may be attached to the horizontal shaft so as to be slidable along the axial direction of the horizontal shaft. In this configuration, rotation of the second rotary member causes the slide member to slide along the horizontal shaft and the vertical shaft, and accordingly the first rotary member to rotate, so that the fall prevention member is able to be smoothly advanced and retracted.

In a transport vehicle according to a preferred embodiment of the present invention, the slide member may be attached to the horizontal shaft, through a slide plate with a long hole whose longitudinal direction is the vertical direction and a spherical plain bearing. With this configuration, variations in the angle and position of the horizontal shaft are able to be absorbed.

In a transport vehicle according to a preferred embodiment of the present invention, the first rotary member may rotate between a first state and a second state in which the tip end portion of the first rotary member is lifted higher than in the first state, and when the first rotary member is rotated from the first state to the second state, the second rotary member may be in a state in which the second rotary member is rotated in one direction until the tip end portion of the second rotary member is in a position past a dead point. As a result, in the second state, even if an unintended external force is applied, the second rotary member hardly rotates in the other direction opposite to the one direction. This reduces or prevents the possibility of unintentional rotation of the first rotary member.

In a transport vehicle according to a preferred embodiment of the present invention, the first rotary member may be rotated between a first state and a second state in which the tip end portion of the first rotary member is lifted higher than in the first state, and the fall prevention mechanism may include an elastic member that generates a moment in a direction of rotating the first rotary member from the first state to the second state. With this configuration, it is possible to reduce the driving force when the first rotary member is rotated from the first state to the second state.

According to preferred embodiments of the present invention, it is possible to reliably prevent falling of a transport object with a simple configuration.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 16A is a diagram illustrating a model of a stopper of the fall prevention mechanism of FIG. 2; FIG. 16B is a diagram illustrating a model of the stopper of the fall prevention mechanism of FIG. 2.

DETAILED DESCRIPTION OF THE PREFERRED EMBODIMENTS

Figure 1:
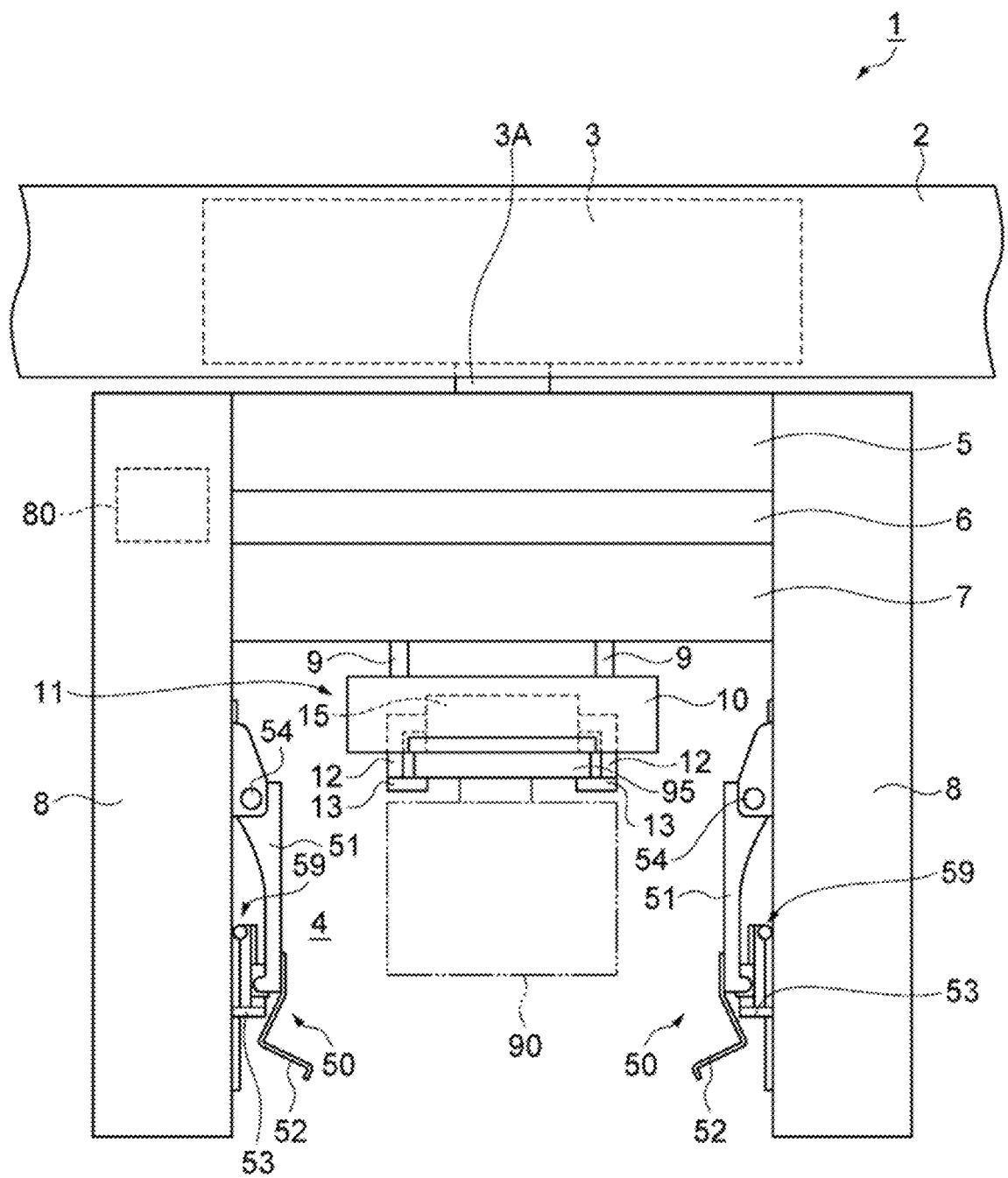
FIG. 1 is a front view of an overhead transport vehicle according to a preferred embodiment of the present invention when a fall prevention mechanism is open.

Hereinafter, preferred embodiments of the present invention will be described in detail with reference to the drawings. In the description of the drawings, the same elements are denoted by the same reference numerals, and redundant description is omitted.

An overhead transport vehicle (transport vehicle) 1 illustrated in FIG. 1 travels along a travel rail 2 provided in a position higher than a floor surface, such as a ceiling of a clean room. The overhead transport vehicle 1 transports a cassette 90 as a transport object between a storage facility and a predetermined load port, for example. For example, multiple reticles are accommodated in the cassette 90. The cassette 90 defines a tray cassette or magazine cassette that is a small and heavy object. The cassette 90 has a flange 95 that is held by the overhead transport vehicle 1.

In the following description, for the convenience of description, the right-left direction (direction X) in FIG. 1 is defined as the front-rear direction (traveling direction) of the overhead transport vehicle 1. The up-down direction in FIG. 1 is defined as the vertical direction (direction Z) of the overhead transport vehicle 1. The depth direction in FIG. 1 is defined as the width direction (direction Y) of the overhead transport vehicle 1. Direction X, direction Y, and direction Z are orthogonal to one another.

As illustrated in FIG. 1, the overhead transport vehicle 1 includes a travel drive portion 3, a horizontal drive portion 5, a rotation drive portion 6, a raising and lowering drive portion 7, an elevator 10, a holder 11, a fall prevention mechanism 50, and a controller 80. The overhead transport vehicle 1 includes a pair of front-rear frames 8, 8 that cover the horizontal drive portion 5, the rotation drive portion 6, the raising and lowering drive portion 7, the elevator 10, and the holder 11 from the front and rear directions. The pair of front-rear frames 8, 8 define a container accommodating portion 4 as a space in which the cassette 90 is accommodated below the holder 11 in a state where the elevator 10 is raised to the rising end.

The travel drive portion 3 moves the overhead transport vehicle 1 along the travel rail 2. The travel drive portion 3 is disposed in the travel rail 2. The travel drive portion 3 drives a roller (not illustrated) that travels on the travel rail 2. The horizontal drive portion 5 is connected to a lower portion of the travel drive portion 3 through a shaft 3A. The horizontal drive portion 5 moves the rotation drive portion 6, the raising and lowering drive portion 7, and the elevator 10 in the Y-axis direction orthogonal to the extending direction of the travel rail 2 in a horizontal plane. The rotation drive portion 6 rotates the raising and lowering drive portion 7 and the elevator 10 in a horizontal plane. The raising and lowering drive portion 7 raises and lowers the elevator 10 by reeling in and reeling out four belts 9. Note that the travel drive portion 3 may include a linear motor or the like that generates a propulsive force for the overhead transport vehicle 1. Additionally, an appropriate suspension member such as a wire or a rope may be used as the belts 9 in the raising and lowering drive portion 7.

The elevator 10 is able to be raised or lowered by the raising and lowering drive portion 7, and defines and functions as a lift stage in the overhead transport vehicle 1. The holder 11 holds the cassette 90. The holder 11 includes a pair of L-shaped arms 12, 12, hands 13, 13 fixed to the arms 12, 12, and an opening and closing mechanism 15 that opens and closes the pair of arms 12, 12.

The pair of arms 12, 12 are connected to the opening and closing mechanism 15. The opening and closing mechanism 15 moves the pair of arms 12, 12 so as to be close to each other and away from each other. Operation of the opening and closing mechanism 15 moves the pair of arms 12, 12 forward and backward. As a result, the pair of hands 13, 13 fixed to the arms 12, 12 open and close. In the present preferred embodiment, the height position of the holder 11 (elevator 10) is set, so that a holding surface of the hand 13 is lower than the height of a lower surface of the flange 95 when the pair of hands 13, 13 are open. Then, when the pair of hands 13, 13 are closed in this state, the holding surfaces of the hands 13, 13 advance to a space below the lower surface of the flange 95. When the elevator 10 is raised in this state, the flange 95 is held by the pair of hands 13, 13, and the cassette 90 is supported.

The fall prevention mechanism 50 is provided in each of the pair of front-rear frames 8, 8. The fall prevention mechanism 50 prevents falling of the cassette 90 held by the holder 11 in the container accommodating portion 4 by advancing a fall prevention member 52 to a space below the cassette 90. Hereinafter, the fall prevention mechanism 50 will be described.

As illustrated in FIGS. 3 to 6, the fall prevention mechanism 50 includes a first rotary member 51, the fall prevention member 52, a second rotary member 53, a lid fall prevention member 20, and a drive mechanism 30. Note that in the following description, only the fall prevention mechanism 50 provided on one of the pair of front-rear frames 8, 8 will be described. Since the fall prevention mechanism 50 provided on the other front-rear frame 8 has a similar configuration, description is omitted.

The first rotary member 51 is an elongated member. A base end portion of the first rotary member 51 is rotatably attached to a first rotation shaft 54 fixed to the front-rear frame 8, and is supported to be rotatable about the first rotation shaft 54. "Rotatable" means that it is rotatable in both rotation directions. The first rotation shaft 54 is a shaft body extending along direction Y (horizontal direction). The first rotation shaft 54 extends from one end portion to the other end portion of the front-rear frame 8 in direction Y. The first rotation shaft 54 is fixed to a surface of the cassette 90 side (hereinafter also simply referred to as "inside") of the front-rear frame 8 through a bracket 55.

The first rotary member 51 is disposed at each of one end and the other end of the front-rear frame 8 in direction Y. The first rotary member 51 includes a horizontal shaft 56. The horizontal shaft 56 is a shaft body extending along direction Y. The horizontal shaft 56 is provided between a tip end portion of one first rotary member 51 and a tip end portion of the other first rotary member 51 so as to connect the two.

Figure 2:
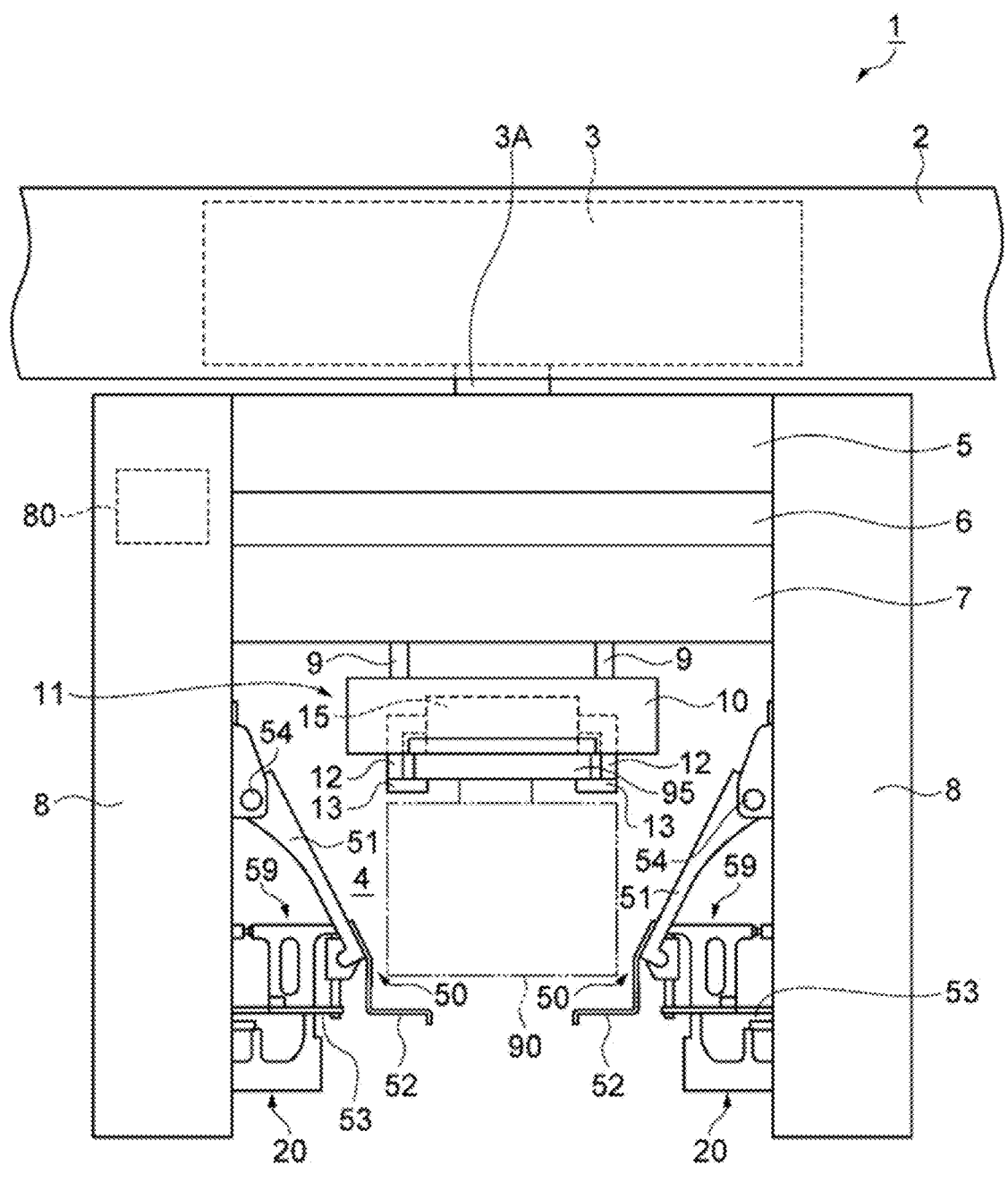
FIG. 2 is a front view of the overhead transport vehicle of FIG. 1 when the fall prevention mechanism is closed.
Figure 3:
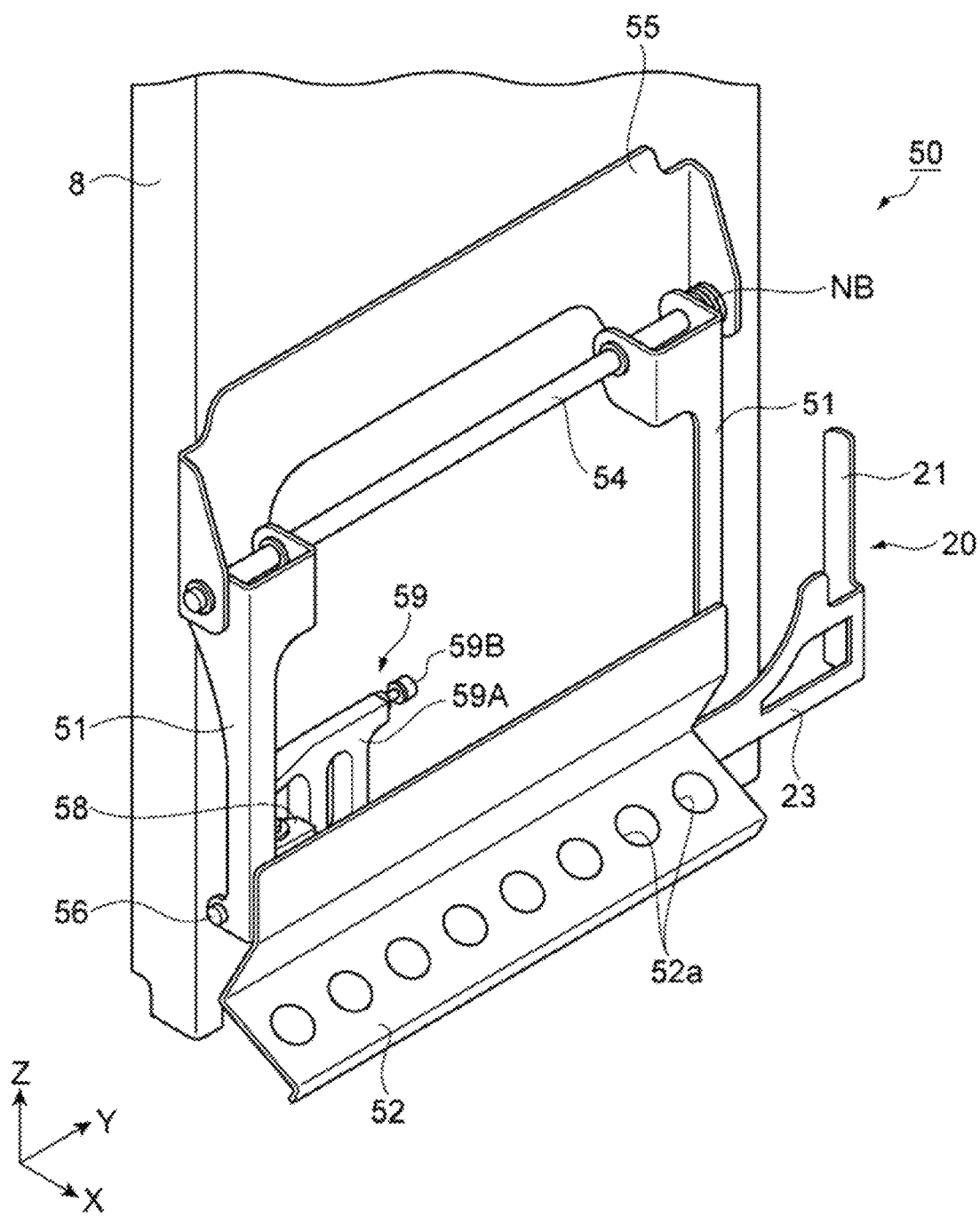
FIG. 3 is a perspective view illustrating the fall prevention mechanism of FIG. 1.
Figure 4:
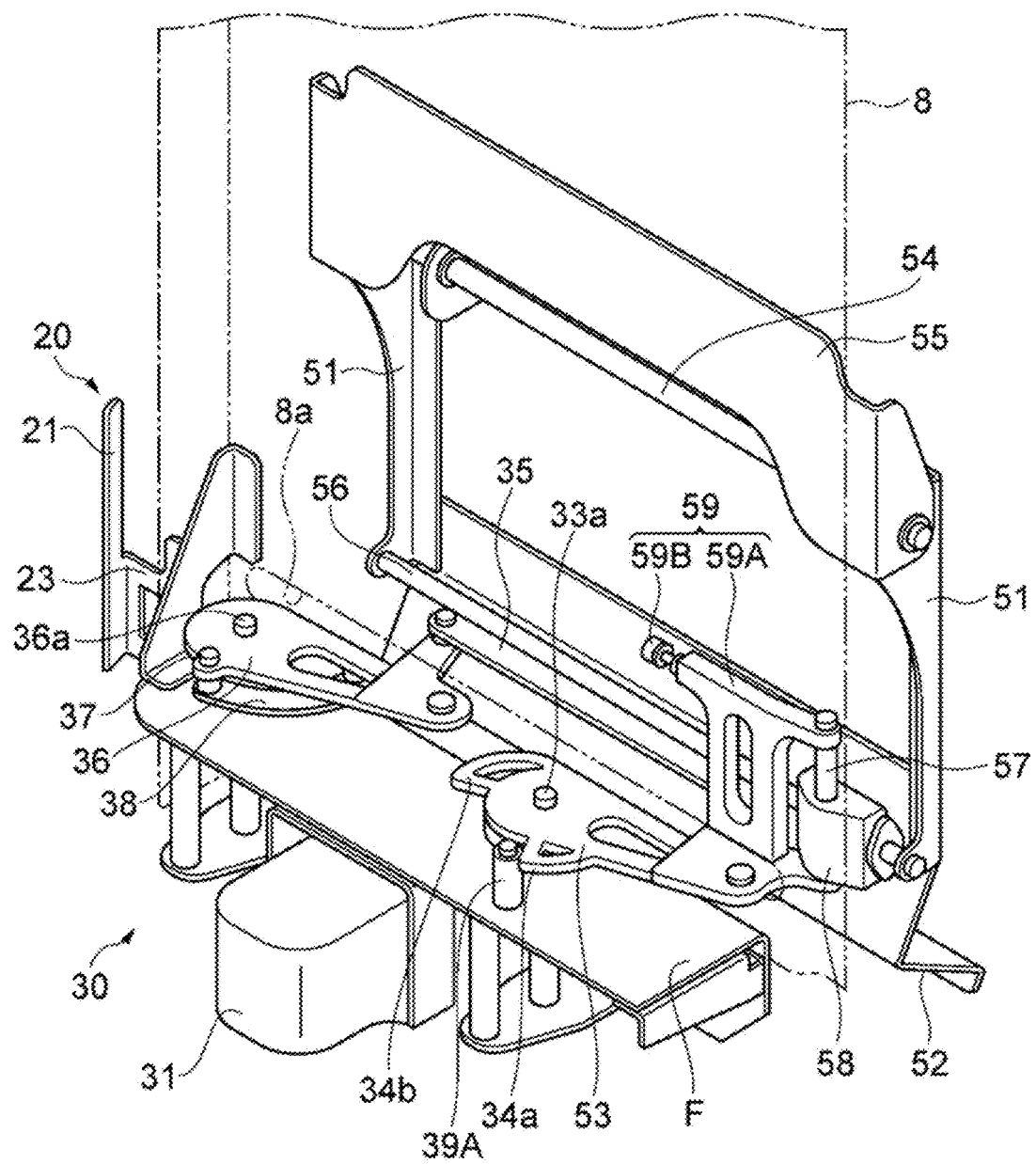
FIG. 4 is a perspective view illustrating the fall prevention mechanism of FIG. 1.
Figure 5:
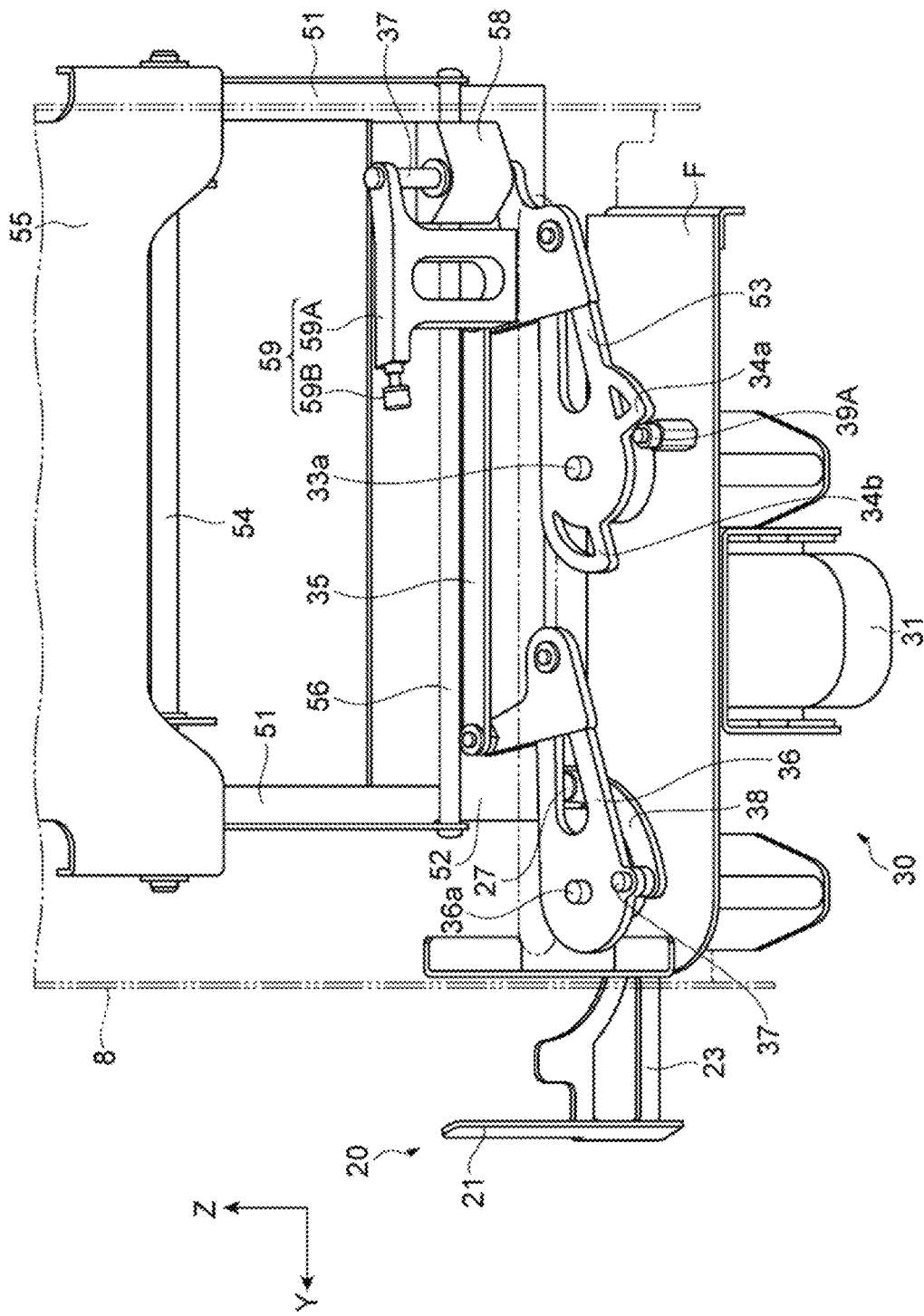
FIG. 5 is a perspective view illustrating the fall prevention mechanism of FIG. 1.
Figure 6:
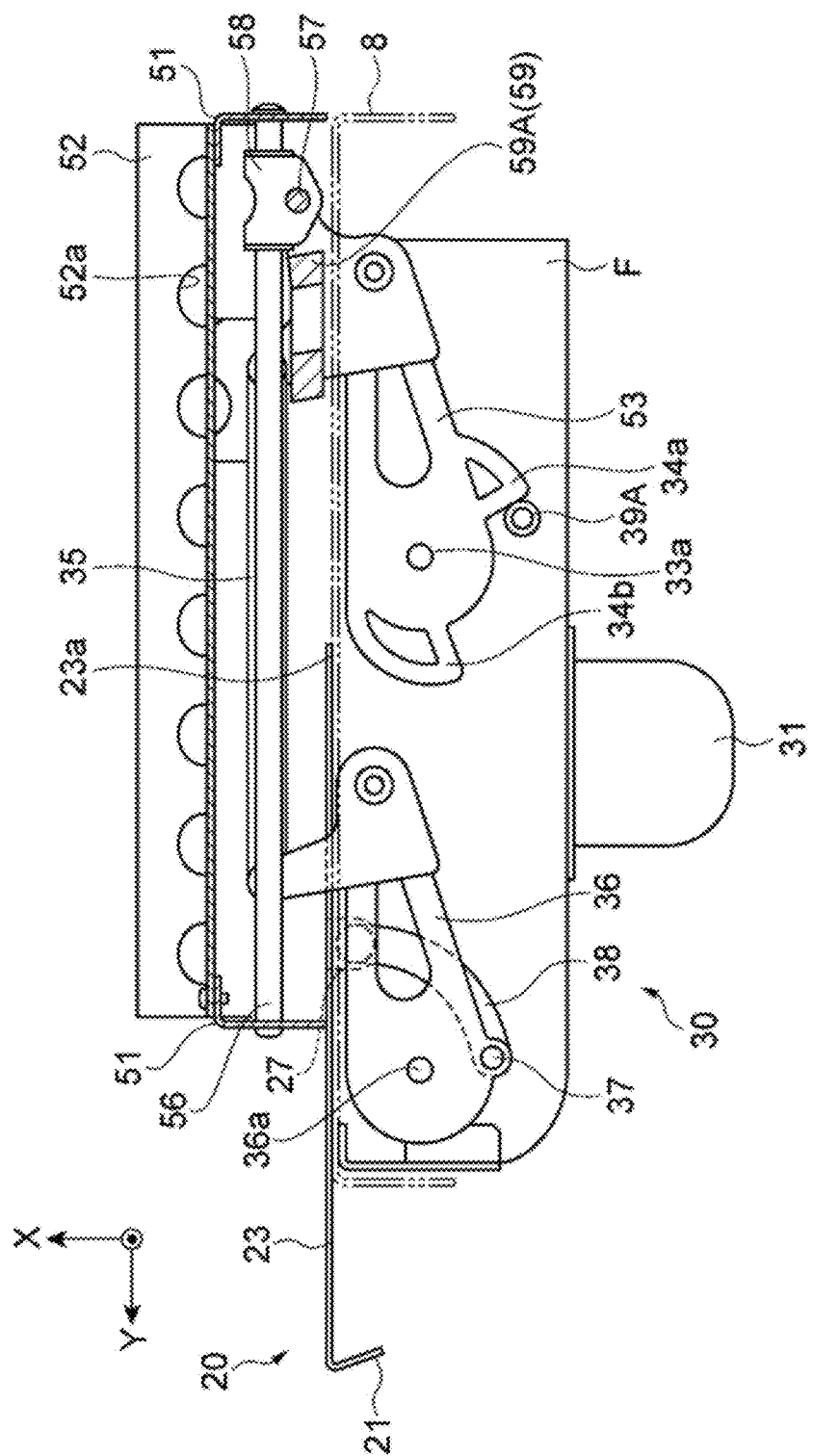
FIG. 6 is a plane cross section illustrating the fall prevention mechanism of FIG. 1.
Figure 7:
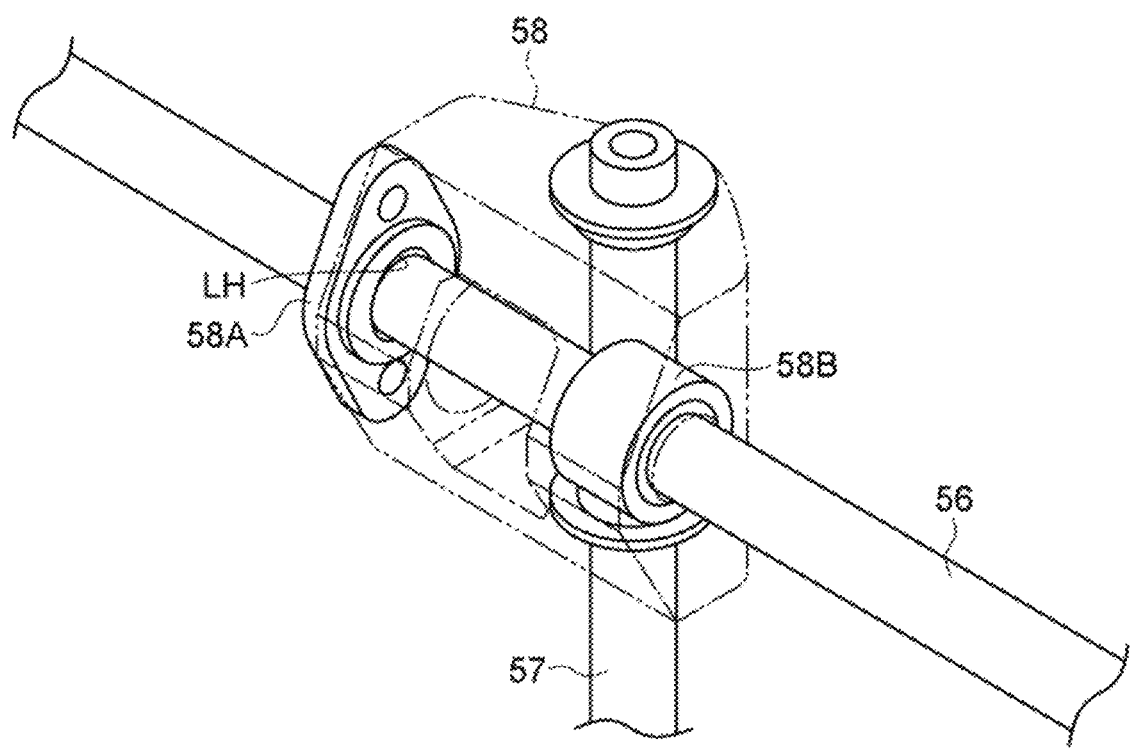
FIG. 7 is a perspective view illustrating a slide member of FIG. 4.

Such a first rotary member 51 rotates between an open state (first state) and a closed state (second state). The first rotary member 51 in the open state is supported by the first rotation shaft 54 and extends straight along direction Z (see FIG. 1). The first rotary member 51 in the closed state is supported by the first rotation shaft 54 in a state in which the tip end portion of the first rotary member 51 is lifted higher than in the open state, and extends so as to be inclined with respect to direction Z and direction X (see FIG. 2).

The fall prevention member 52 is provided on an inner surface of the tip end portion of the first rotary member 51. The fall prevention member 52 has a bent plate shape. The base end side of the fall prevention member 52 is fixed so as to be bridged across the tip end portions of the pair of first rotary members 51. In the illustrated example, when viewed from direction Y, the fall prevention member 52 extends along the first rotary member 51 on the base end side, bends to the opposite side of the cassette 90 (hereinafter also simply referred to as "outside"), bends inward by 90 degrees, and is further folded back toward the outside at the other end. The fall prevention member 52 has holes 52*a* to reduce weight while ensuring necessary and sufficient rigidity.

When the first rotary member 51 is rotated to the open state, the tip end side of the fall prevention member 52 moves away from below the cassette 90 (see FIG. 1). When the first rotary member 51 is rotated to the closed state, the tip end side of the fall prevention member 52 advances to a space below the cassette 90 (see FIG. 2). That is, the fall prevention member 52 can advance (overhang) to a space below the cassette 90.

The second rotary member 53 is a plate-shaped member that is long and has a thickness in direction Z. A base end portion of the second rotary member 53 is integrally connected to a later-described second rotation shaft 33*a* extending along direction Z, and is supported so as to be rotatable about the second rotation shaft 33*a*. The base end portion of the second rotary member 53 is accommodated in the front-rear frame 8.

At least a tip end portion of the second rotary member 53 is exposed through a slit 8*a* of the front-rear frame 8 (projects to the outside from the inside of the front-rear frame 8). The first rotary member 51 is attached to the tip end portion of the second rotary member 53. The tip end portion of the second rotary member 53 includes a vertical shaft 57, a slide member 58, and a stopper 59.

The vertical shaft 57 is a shaft body extending along direction Z. The vertical shaft 57 is erected at the tip end of the second rotary member 53. The slide member 58 is attached to the vertical shaft 57 so as to be slidable in direction Z. Additionally, the slide member 58 is attached to the horizontal shaft 56 of the first rotary member 51 so as to be slidable along direction Y. Here, the slide member 58 is attached to the horizontal shaft 56 through a slide plate 58A that includes an elongated hole LH whose longitudinal direction is direction Z and a spherical plain bearing 58B.

When the second rotary member 53 rotates in one rotation direction (closing direction) or the other rotation direction (opening direction), the slide member 58 moves in direction Y along the horizontal shaft 56, and the position of the slide member 58 in direction X changes. In response to this, the first rotary member 51 rotates so that the tip end side of the first rotary member 51 is lifted or lowered, and the slide member 58 moves in direction Z along the vertical shaft 57. As a result, the first rotary member 51 is switched between the closed state and the open state (the fall prevention mechanism 50 is switched between a closed state and an open state) (details will be described later).

The stopper 59 is provided on the second rotary member 53. The stopper 59 restricts rotation of the first rotary member 51 when a force is applied to the first rotary member 51 in the closed state. For example, when a force is applied to rotate the first rotary member 51 in the closed state toward the open state, the stopper 59 restricts rotation of the first rotary member 51 toward the open state. The stopper 59 has a plate-shaped member 59A and a contact portion 59B. The plate-shaped member 59A is located on the second rotary member 53. One end side of the plate-shaped member 59A supports an upper end portion of the vertical shaft 57. The contact portion 59B is provided at an end on the other end side of the plate-shaped member 59A. The contact portion 59B is able to come into contact with an inner surface of the front-rear frame 8 when the first rotary member 51 is in the closed state. In such a stopper 59, when the first rotary member 51 is in the open state, the plate-shaped member 59A extends along direction Y. On the other hand, in the stopper 59, when the first rotary member is in the closed state, the plate-shaped member 59A extends along direction X, and the contact portion 59B faces the inner surface of the front-rear frame 8 in direction X.

Figure 14:
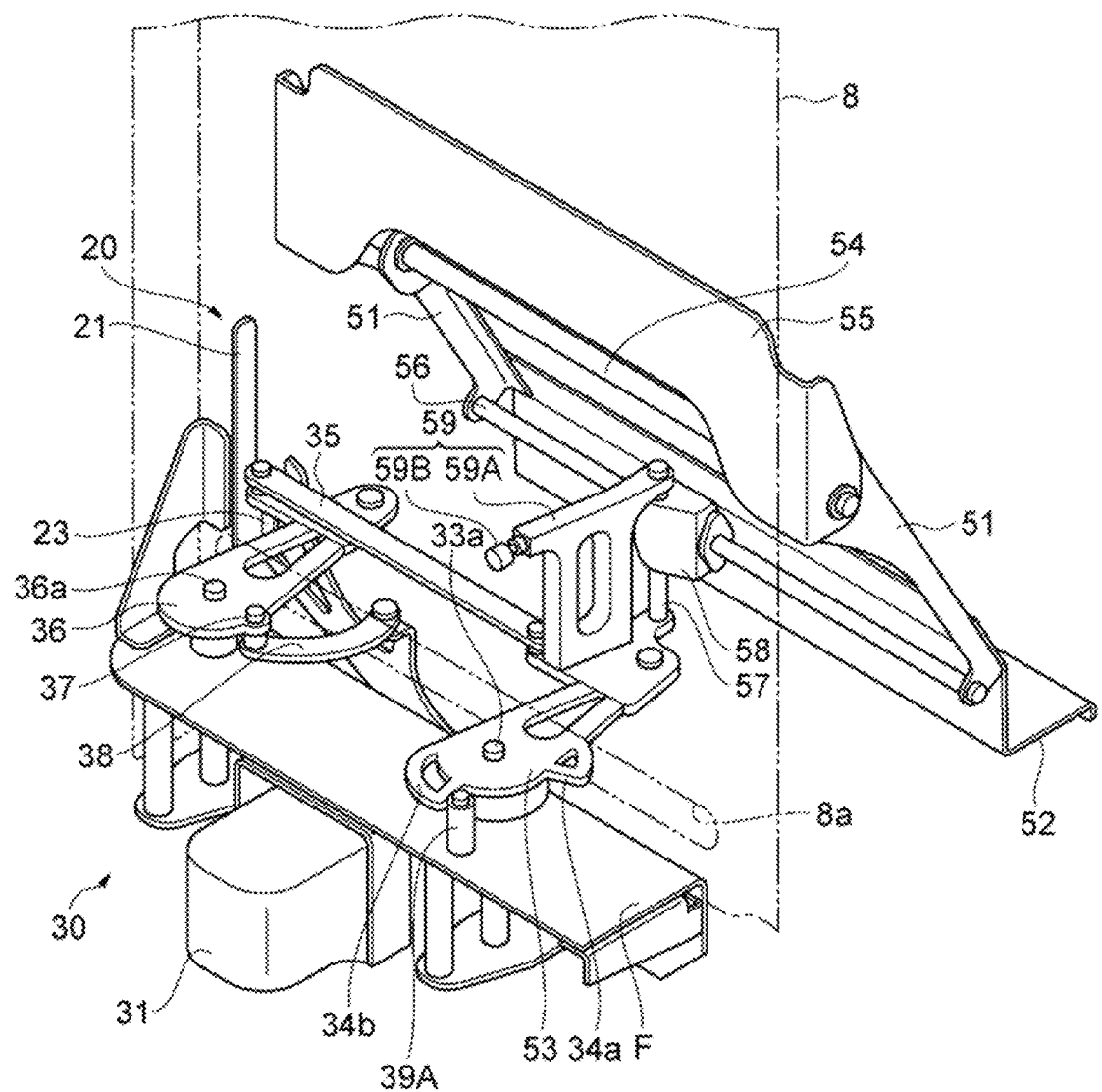
FIG. 14 is a perspective view illustrating the fall prevention mechanism of FIG. 2.

The second rotary member 53 includes a first locking portion 34*a* and a second locking portion 34*b*. When the second rotary member 53 rotates in the closing direction and the second locking portion 34*b* is locked to a stopper 39A provided around the base end portion of the second rotary member 53, the second rotary member 53 is restrained from rotating further in the closing direction (see FIG. 14). When the second rotary member 53 rotates in the opening direction and the first locking portion 34*a* is locked to the stopper 39A, the second rotary member 53 is restrained from rotating further in the opening direction (see FIG. 4).

Figure 15:
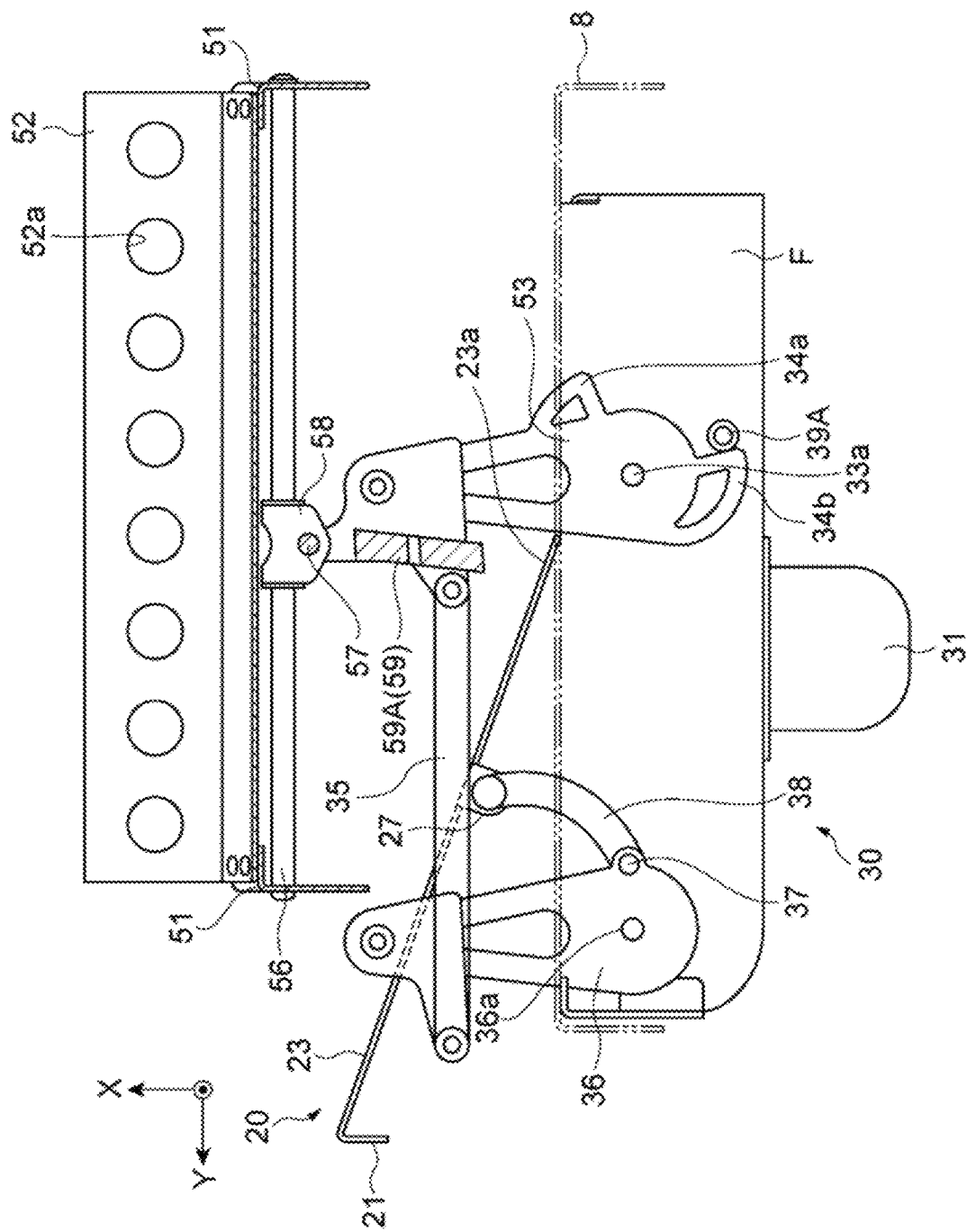
FIG. 15 is a plane cross section illustrating the fall prevention mechanism of FIG. 2.

When the first rotary member 51 is in the closed state, the second rotary member 53 is in a state in which the second rotary member 53 is rotated in the closing direction until the tip end of the second rotary member 53 reaches a position past a dead point in direction X (see FIG. 15). That is, when the second rotary member 53 is rotated in the closing direction, the position in direction X of the vertical shaft 57 provided in the tip end portion of the second rotary member 53 moves to the cassette 90 side to reach the dead point (a point closest to the cassette 90), and stops after moving back to the opposite side of the cassette 90. "Dead point" is also referred to as top dead center or change point.

The lid fall prevention member 20 is a member that prevents falling of a lid coming off the cassette 90 held in the container accommodating portion 4. The lid fall prevention member 20 has a bent plate shape. The lid fall prevention member 20 moves between an advanced position and a retracted position with rotation of the second rotary member 53. The lid fall prevention member 20 includes a lower support portion 23 and a front support portion 21. The front support portion 21 is disposed so as to face at least a portion of the lid of the cassette 90 at the advanced position, and is retracted from the front of the lid of the cassette 90 at the retracted position.

The drive mechanism 30 is accommodated in the front-rear frame 8. The drive mechanism 30 includes a driving portion 31, a second rotation shaft 33a, a first link portion 35, a second link portion 36, and a third link portion 38. The drive mechanism 30 is fixed to a frame F of the front-rear frame 8. The drive mechanism 30 converts a rotational movement by the driving portion 31 into an opening and closing operation of the fall prevention mechanism 50.

The driving portion 31 is a stepping motor, for example. The driving portion 31 is controlled by the controller 80. The driving portion 31 rotates the second rotation shaft 33a in both directions to rotate the second rotary member 53. The second rotation shaft 33a is a shaft body extending along direction Z (vertical direction). The first link portion 35 is a plate-shaped member that extends along the Y-axis direction. One end of the first link portion 35 is connected to the tip end portion of the second rotary member 53. The other end of the first link portion 35 is connected to a tip end portion of the second link portion 36.

A base end portion of the second link portion 36 is integrally connected to a rotation shaft 36a extending along the Z-axis direction, and is supported so as to be rotatable about the rotation shaft 36a. The second link portion 36 is connected to the second rotary member 53 through the first link portion 35, and rotates with rotation of the second rotary member 53.

One end of the third link portion 38 is connected to a shaft 37 provided in a position shifted from the center of the rotation shaft 36a in the second link portion 36. The other end of the third link portion 38 is connected to an attachment portion provided on the lower support portion 23 of the lid fall prevention member 20. A base end portion 23a of the lower support portion 23 opposite to an end portion thereof where the front support portion 21 is provided is attached to the frame F so as to be rotatable about an axis extending in the Z-axis direction. As a result, the lower support portion 23 is able to rotate about the base end portion 23a serving as the rotation axis. The lower support portion 23 is connected to the second link portion 36 through the third link portion 38, and rotates with rotation of the second link portion 36. As a result, when the second link portion 36 rotates with rotation of the second rotary member 53, the lid fall prevention member 20 operates between the retracted position and the advanced position.

The controller 80 (see FIG. 1) preferably controls each element and portion of the overhead transport vehicle 1. The controller 80 preferably includes a central processing unit (CPU), a random access memory (RAM), a read only memory (ROM), and the like. In the controller 80, various types of control is executed by cooperation of hardware such as the CPU, RAM and ROM, and software such as a program.

Figure 8:
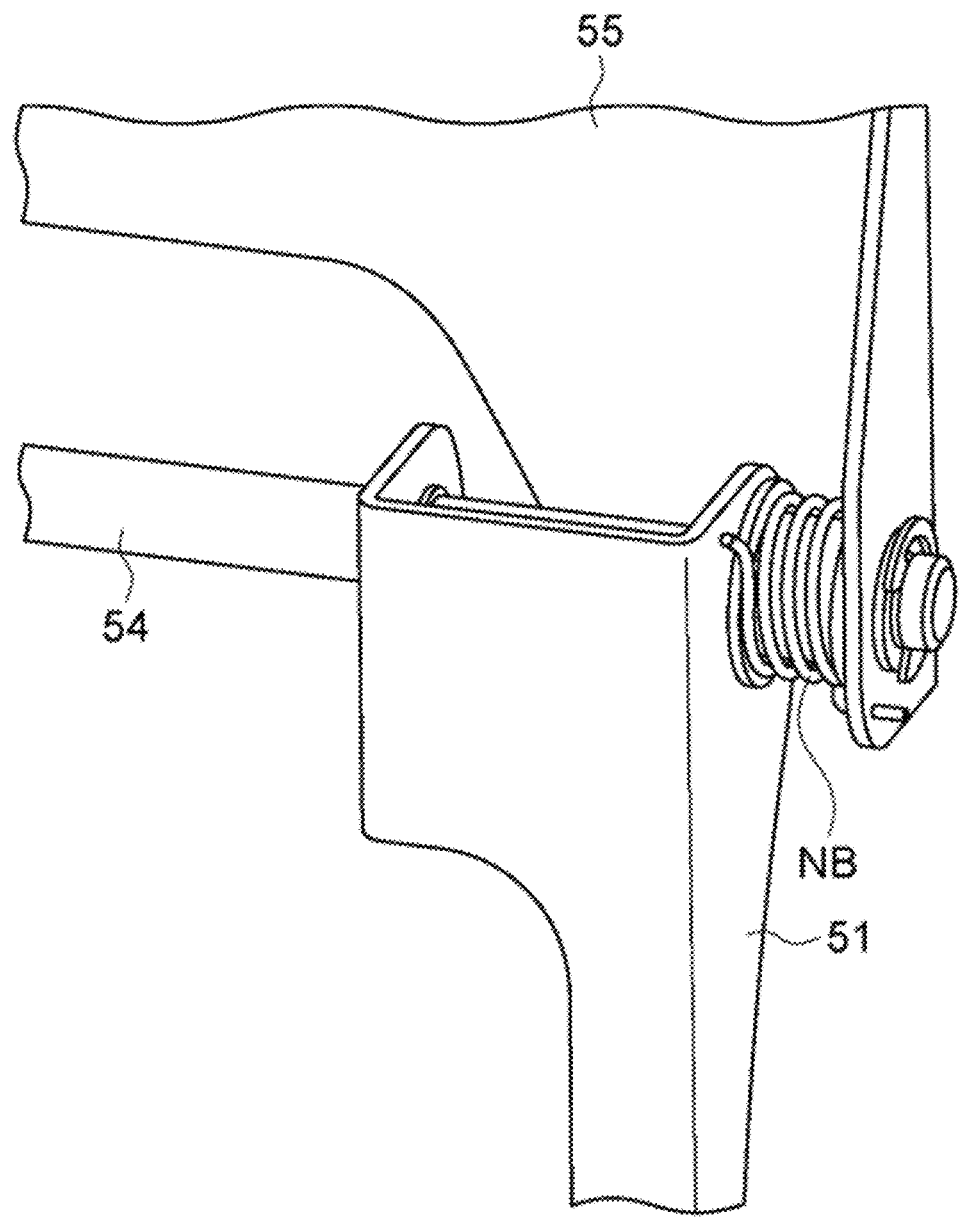
FIG. 8 is a perspective view illustrating a torsion spring of FIG. 3.

As illustrated in FIG. 8, the fall prevention mechanism includes a torsion spring NB. The torsion spring NB is an elastic member that generates a moment in the direction of rotating the first rotary member 51 from the open state to the closed state. The torsion spring NB is attached to the first rotation shaft 54 and the first rotary member 51.

Next, an operation of the fall prevention mechanism 50 will be described. In the following description, an open to closing operation of the fall prevention mechanism 50 (that is, an operation of the fall prevention mechanism 50 when the first rotary member 51 transitions from the open state to the closed state) will be exemplified.

As illustrated in FIGS. 1 and 3 to 6, when the first rotary member 51 is in the open state, the first rotary member 51 extends along direction Z while the second rotary member 53 extends along direction Y, and the fall prevention mechanism 50 is in a folded state. At this time, the fall prevention member 52 is retracted from below the cassette 90. The first locking portion 34a of the second rotary member 53 is locked to the stopper 39A. The stopper 59 extends along direction Y between the front-rear frame 8 and the first rotary member 51. The slide member 58 is positioned on one end side of the horizontal shaft 56 and on the lower side of the vertical shaft 57. The lid fall prevention member 20 is in the retracted position.

Figure 9:
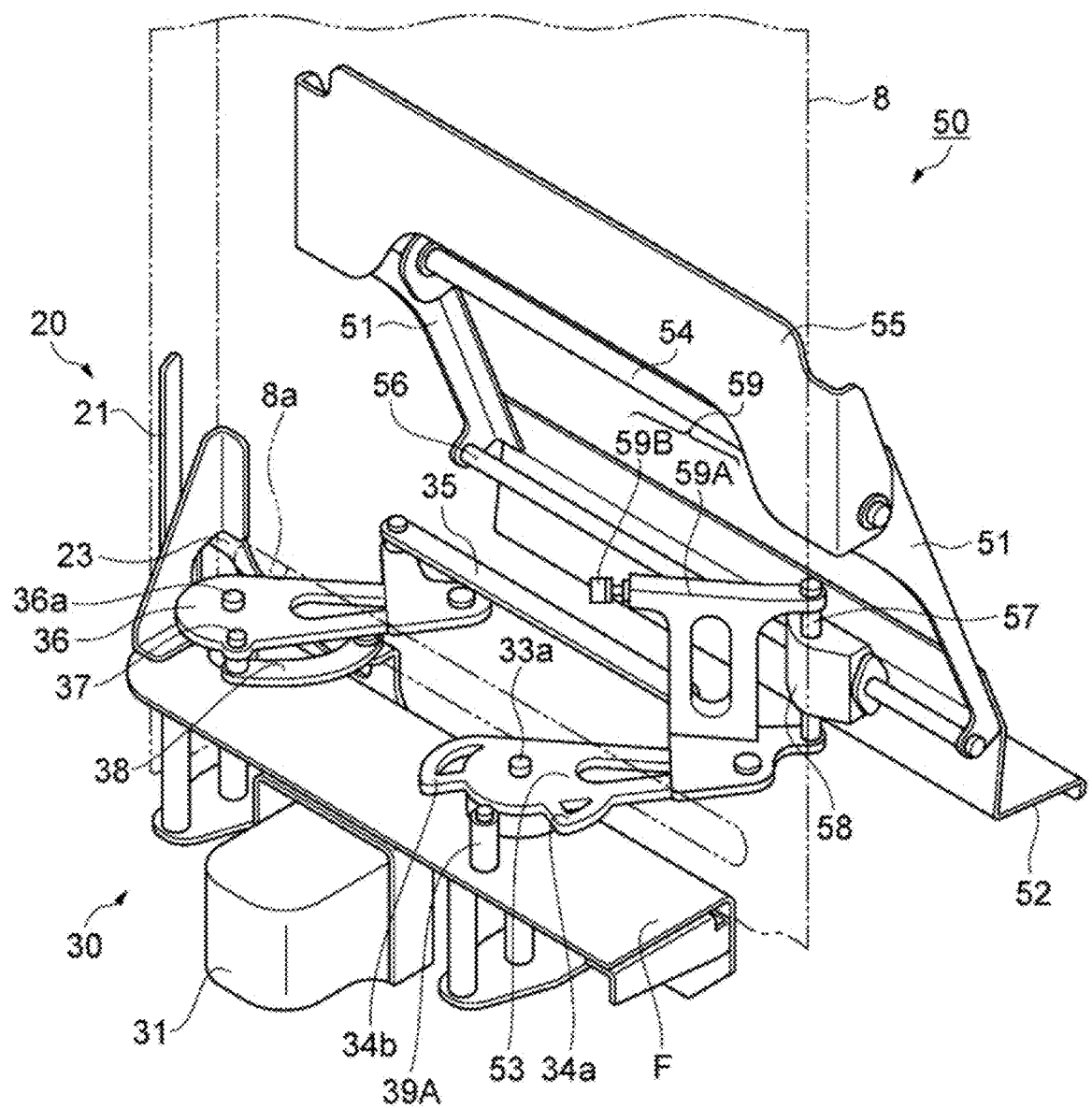
FIG. 9 is a perspective view of the overhead transport vehicle of FIG. 1 when a second rotary member of the fall prevention mechanism is rotated in a closing direction.
Figure 10:
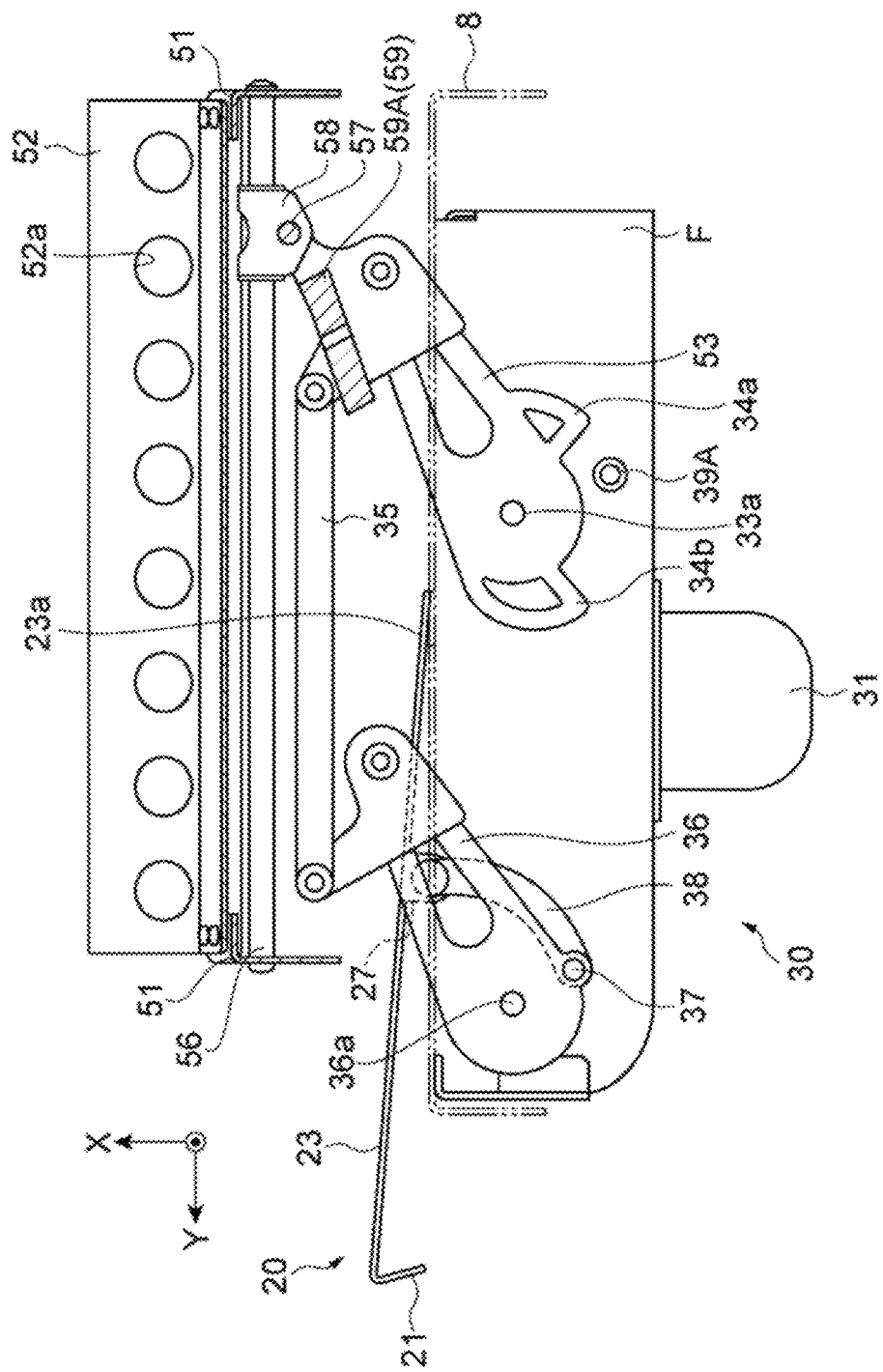
FIG. 10 is a plane cross section of the overhead transport vehicle of FIG. 1 when the second rotary member of the fall prevention mechanism is rotated in the closing direction.

As illustrated in FIGS. 9 and 10, when the second rotary member 53 rotates in the closing direction by being driven by the driving portion 31, the rotation causes the slide member 58 to slide along the horizontal shaft 56 toward the other end side in direction Y, and the slide member 58 moves inward in direction X (cassette 90 side). In response to this, the first rotary member 51 rotates so that the tip end side of the first rotary member 51 is lifted, and the slide member 58 slides upward along the vertical shaft 57. The fall prevention member 52 protrudes inward. The stopper 59 extends between the front-rear frame 8 and the first rotary member 51 so as to be inclined with respect to direction Y. The lid fall prevention member 20 moves from the retracted position toward the advanced position.

Figure 11:
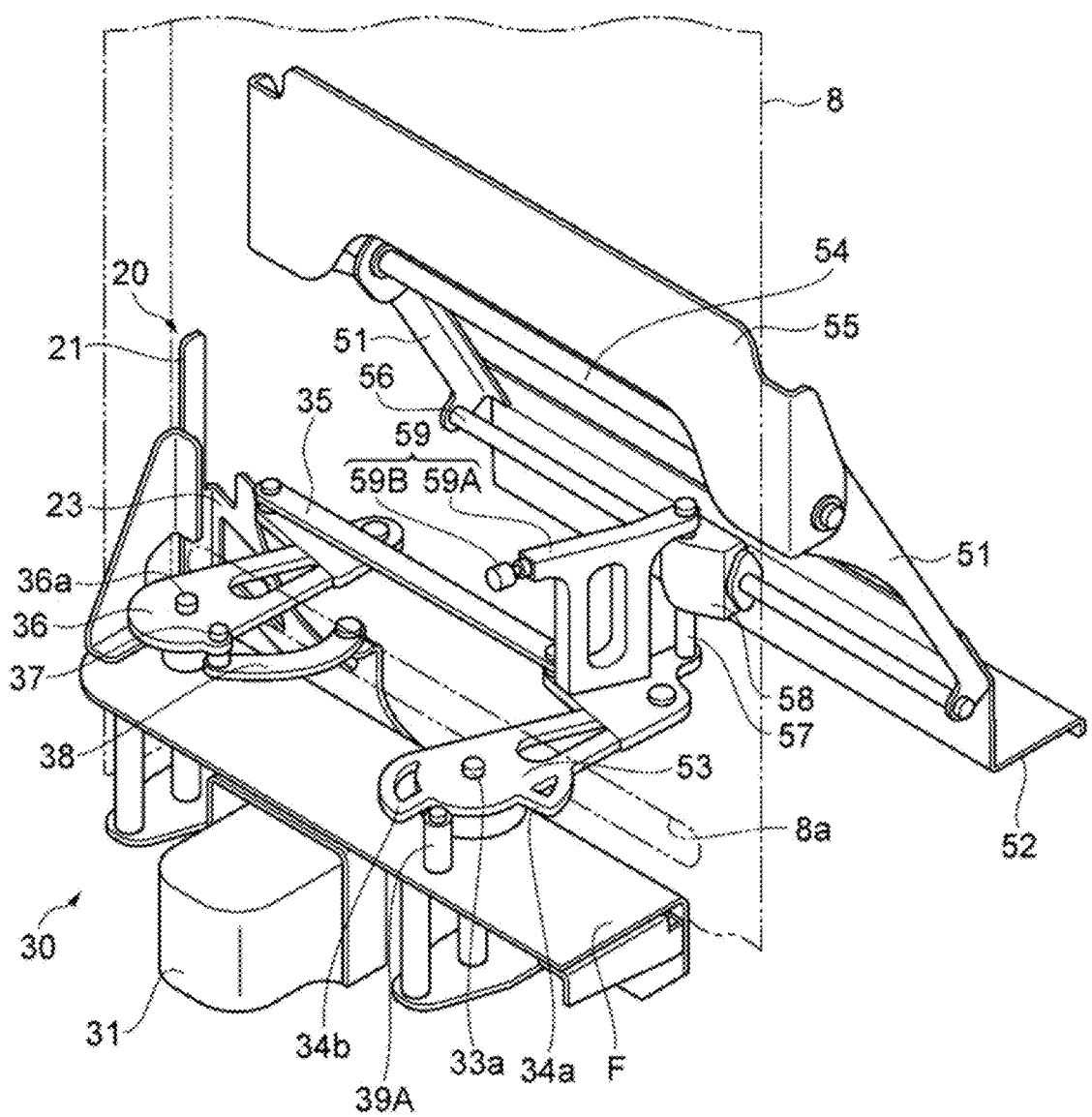
FIG. 11 is a perspective view of the overhead transport vehicle of FIG. 9 when the second rotary member of the fall prevention mechanism is rotated in the closing direction.
Figure 12:
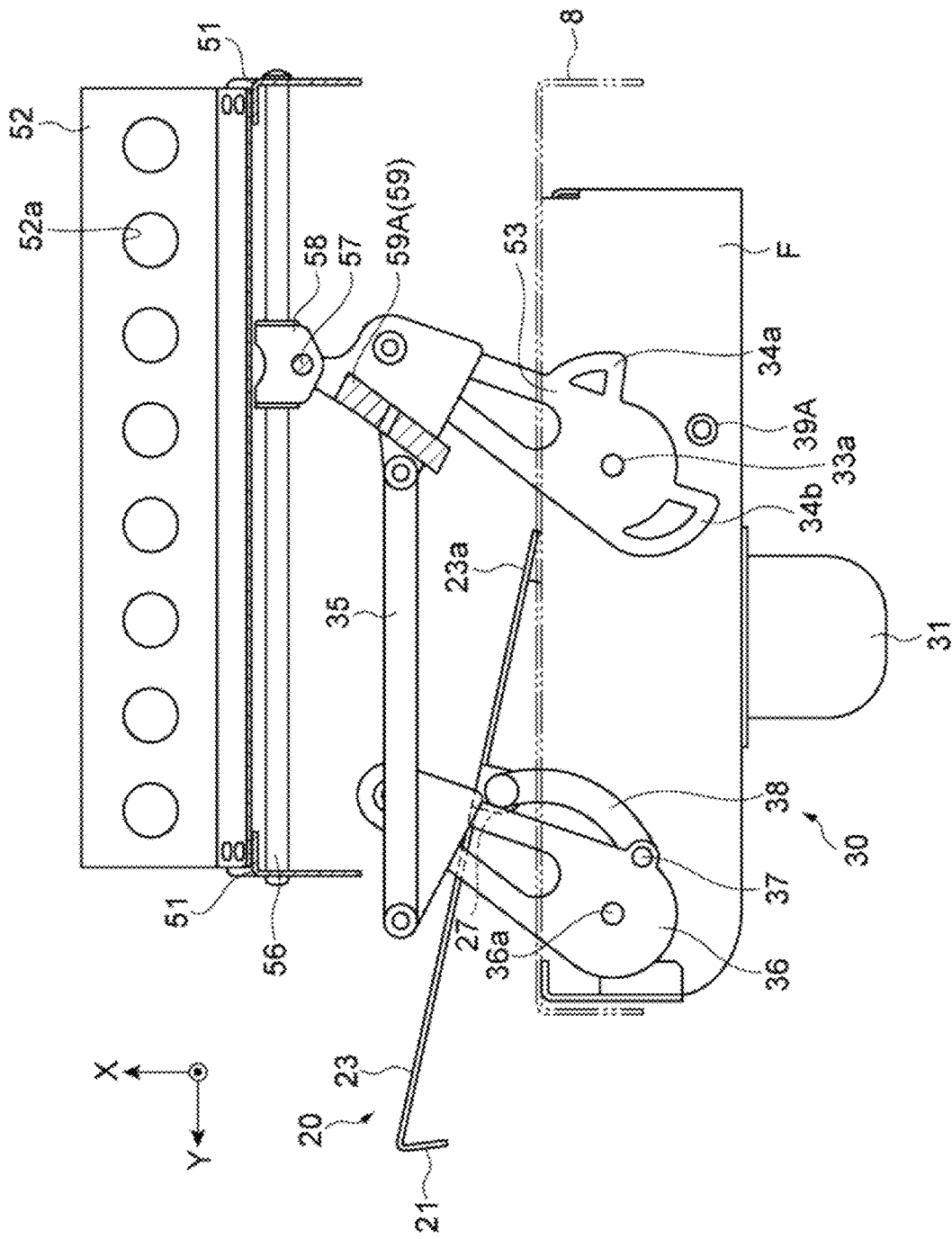
FIG. 12 is a plane cross section of the overhead transport vehicle of FIG. 9 when the second rotary member of the fall prevention mechanism is rotated in the closing direction.
Figure 13:
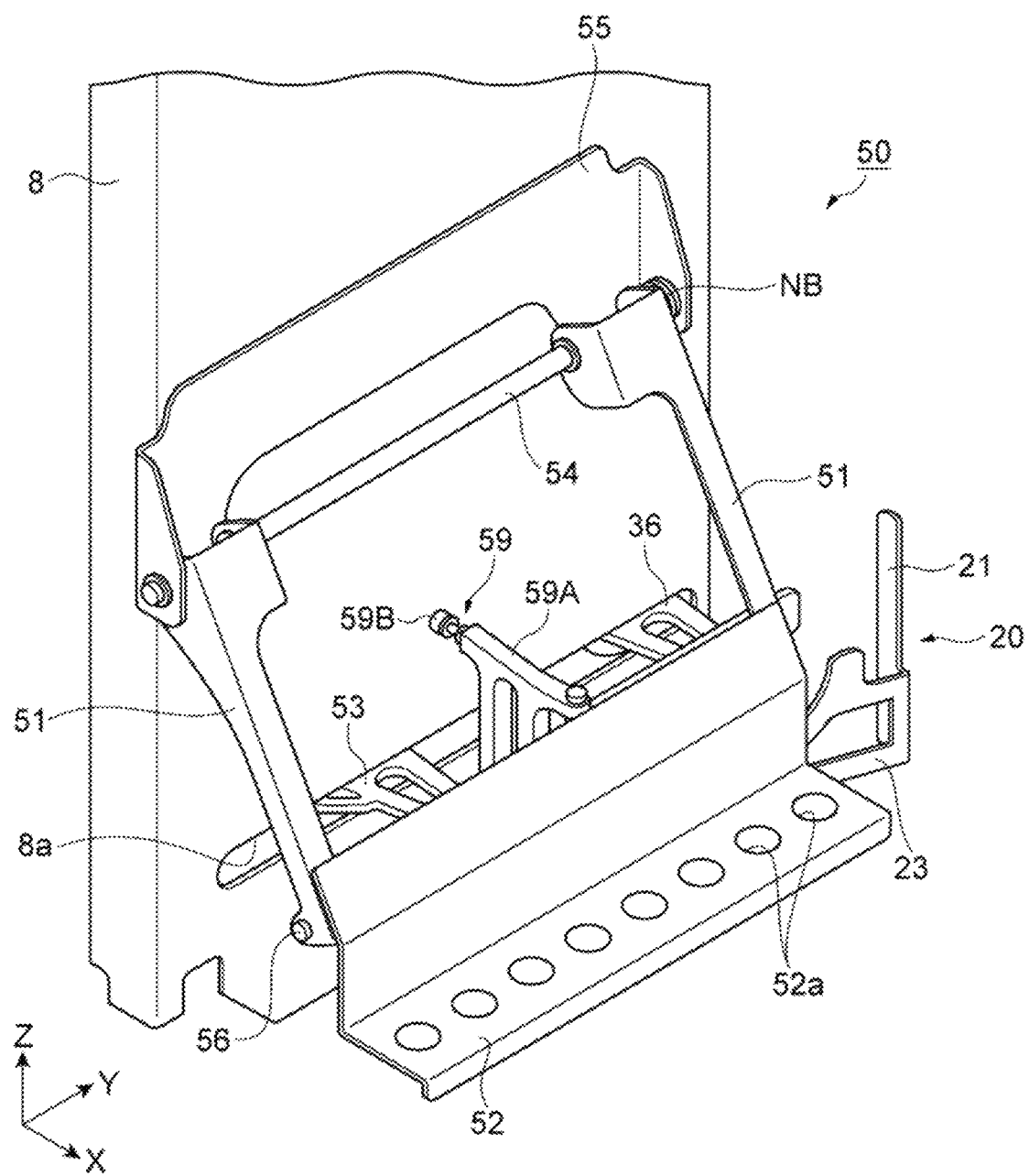
FIG. 13 is a perspective view illustrating the fall prevention mechanism of FIG. 2.

As illustrated in FIGS. 11 and 12, when the second rotary member 53 continuously rotates in the closing direction by being driven by the driving portion 31, the rotation causes the slide member 58 to slide further along the horizontal shaft 56 toward the other end side in direction Y, and the slide member 58 moves further inward in direction X. In response to this, the first rotary member 51 rotates so that the tip end side of the first rotary member 51 is lifted higher, and the slide member 58 slides further upward along the vertical shaft 57. The fall prevention member 52 protrudes further inward. The stopper 59 extends between the front-rear frame 8 and the first rotary member 51 so as to be inclined with respect to direction X. The lid fall prevention member 20 moves further from the retracted position toward the advanced position.

Then, as illustrated in FIGS. 2 and 13 to 15, when the second rotary member 53 rotates in the closing direction by being driven by the driving portion 31 and the first rotary member 51 reaches the closed state, the first rotary member 51 is in the closed state. When the first rotary member 51 is in the closed state, the first rotary member 51 extends so as to be inclined with respect to direction Z and direction X while the second rotary member 53 extends along direction X, and the fall prevention mechanism 50 is in a deployed state.

At this time, the fall prevention member 52 largely protrudes inward and sufficiently advances to the space below the cassette 90. The second locking portion 34b of the second rotary member 53 is locked to the stopper 39A. The stopper 59 extends in direction X between the front-rear frame 8 and the first rotary member 51, and the contact portion 59B faces the inner surface of the front-rear frame 8 in direction X. The slide member 58 is positioned in a central portion or approximately central portion of the horizontal shaft 56 and on the upper side of the vertical shaft 57. The second rotary member 53 is rotated in the closing direction until the vertical shaft 57 is in a position past the dead point. The lid fall prevention member 20 is in the advanced position. Note that a closed to opening operation of the first rotary member 51 progresses in reverse to the above-described operation.

As described above, in the overhead transport vehicle 1, the fall prevention member 52 can be supported by a truss structure including the first rotary member 51 and the second rotary member 53, and the strength of the fall prevention mechanism 50 is thus increased efficiently. Hence, even when a heavy cassette 90 is transported, for example, it is possible to reliably prevent falling of the cassette 90 with a simple configuration. Since the fall prevention member 52 can protrude largely to the space below the cassette 90, the overhang amount of the fall prevention member 52 is less likely to be insufficient. For example, even when a small cassette or a small and heavy cassette 90 is transported, it is possible to reliably prevent falling of the cassette 90.

The overhead transport vehicle 1 includes the stopper 59 provided on the second rotary member 53. According to the stopper 59, when a force is applied to the first rotary member 51 in the closed state (the state in which the fall prevention member 52 is advanced below the cassette 90), rotation of the first rotary member 51 is restricted. For example, as illustrated as a model in FIGS. 16A and 16B, when a force is applied to rotate the first rotary member 51 in the closed state toward the open state, the contact portion 59B of the stopper 59 comes into contact with the front-rear frame 8 and restricts rotation of the first rotary member 51 toward the open state. As a result, even if a force is applied to the first rotary member 51 in the closed state, it is possible to curb distortion of the fall prevention mechanism 50. This makes it possible to prevent falling of the cassette 90 more reliably.

In the overhead transport vehicle 1, the first rotary member 51 includes a horizontal shaft 56. The tip end portion of the second rotary member 53 includes the vertical shaft 57 and the slide member 58 slidable relative to the horizontal shaft 56 and the vertical shaft 57. In this configuration, rotation of the second rotary member 53 causes the slide member 58 to slide along the horizontal shaft 56 and the vertical shaft 57, and accordingly the first rotary member 51 to rotate, so that the fall prevention member 52 can be smoothly advanced and retracted. When the first rotary member 51 is in the open state, the fall prevention mechanism 50 can be configured compactly.

Figure 17A:
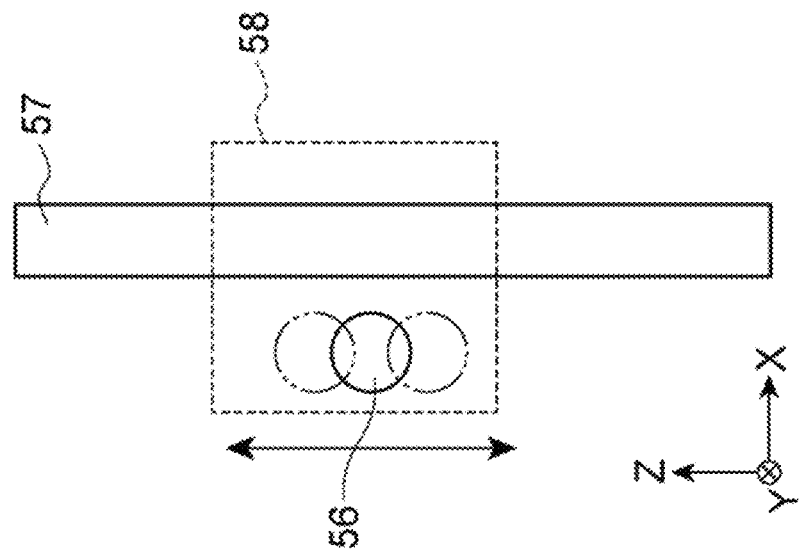
FIG. 17A is a schematic diagram for describing an effect of a spherical plain bearing.
Figure 17B:
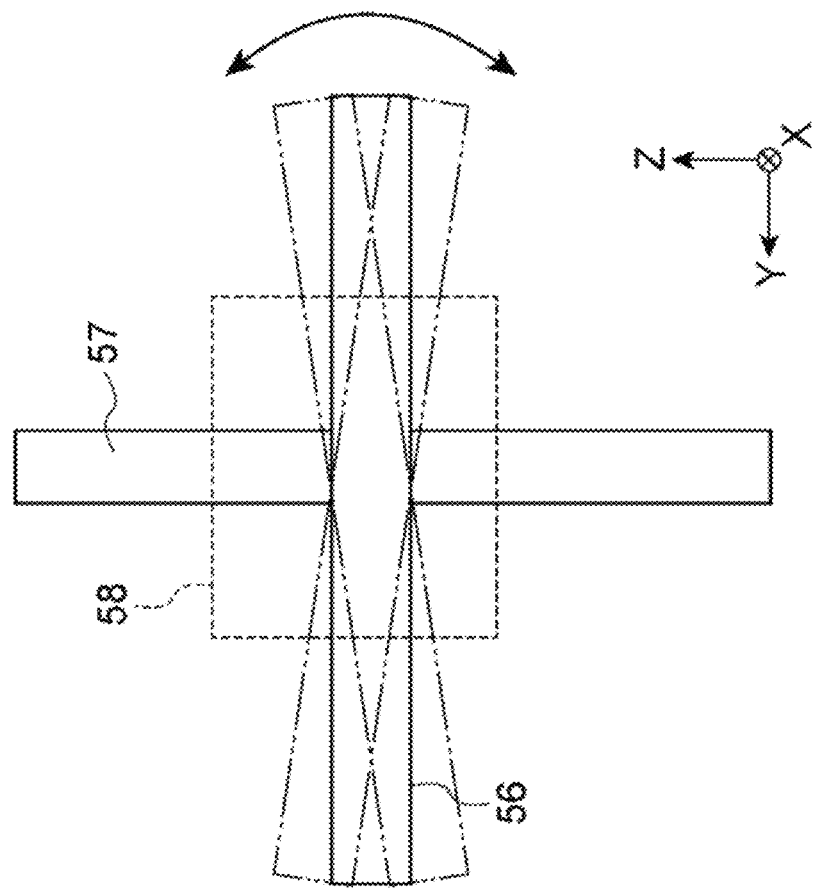
FIG. 17B is a schematic diagram for describing an effect of a slide plate.

In the overhead transport vehicle 1, the slide member 58 is attached to the horizontal shaft 56 through a slide plate 58A and a spherical plain bearing 58B. In this configuration, as illustrated in FIG. 17A, the spherical plain bearing 58B can absorb variations in the angle (tilt) of the horizontal shaft 56 with respect to the vertical shaft 57. As illustrated in FIG. 17B, the slide plate 58A can absorb variations in the position of the horizontal shaft 56 in direction Z.

In the overhead transport vehicle 1, the second rotary member 53 is configured such that when the fall prevention member 52 is advanced to the space below the cassette 90 (when the first rotary member 51 is rotated to the closed state), the tip end portion of the second rotary member 53 is rotated in the closing direction to a position past the dead point in direction X. As a result, in the closed state in which the fall prevention member 52 is advanced to the space below the cassette 90, even if an unintended external force is applied, the second rotary member 53 hardly rotates in the opening direction. This reduces the possibility of unintentional rotation of the first rotary member 51 in the closed state toward the open state.

The overhead transport vehicle 1 includes the torsion spring NB that generates a moment in the direction of rotating the first rotary member 51 from the open state to the closed state. In this configuration, the force that rotates the first rotary member 51 to the closed state acts on the first rotary member 51. Hence, it is possible to reduce the driving force when the first rotary member 51 is rotated from the open state to the closed state. Note that instead of or in addition to the torsion spring NB, the configuration may include various elastic members that can generate, in the first rotary member 51, a moment in the direction of rotating the first rotary member 51 from the open state to the closed state. Additionally, if the resistance (frictional force) when the first rotary member 51 is rotated from the open state to the closed state is sufficiently small, or the driving force when the first rotary member 51 is rotated from the open state to the closed state is sufficiently large, the driving force need not be assisted by an elastic member such as the torsion spring NB.

As mentioned above, while preferred embodiments of the present invention have been described above, the present invention is not limited to the above preferred embodiments, and various changes can be made without departing from the gist of the present invention.

In the above preferred embodiments, the first rotary member 51 and the second rotary member 53 are rotated by the driving force of the driving portion 31. Instead, the first rotary member 51 and the second rotary member 53 may be rotated manually by an operator or the like. In the above preferred embodiments, the elements or structural portions may be fixed by a fastener such as a screw, or by other various known methods.

In the above preferred embodiment, the first rotary member 51 is rotatably supported by the first rotation shaft 54 as a shaft body, and the second rotary member 53 is rotatably supported by the second rotation shaft 33a as a shaft body. However, in some supporting structures, at least one of the first rotating shaft and the second rotating shaft may be a virtual shaft.

In the above preferred embodiments, the tip end portion of the second rotary member 53 is attached to the first rotary member 51 using the horizontal shaft 56, the vertical shaft 57, and the slide member 58. However, various known configurations may be adopted as the attachment configuration. In the above preferred embodiments, the slide member 58 is attached to the horizontal shaft 56 through the slide plate 58A and the spherical plain bearing 58B. However, in some cases, at least any one of the slide plate 58A and the spherical plain bearing 58B may be omitted.

In the above preferred embodiments, an example in which the controller 80 is provided in the front-rear frame 8 has been described. However, instead of or in addition to the controller 80, a control device (controller) that controls the overhead transport vehicle 1 through a network or the like may be provided at a location different from the overhead transport vehicle 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport vehicle that transports a transport object, the transport vehicle comprising:
a fall prevention mechanism that prevents falling of the transport object by advancing a fall prevention member to a space below the transport object; wherein
the fall prevention mechanism includes:
a first rotary member including a base end portion supported so as to be rotatable about a first rotation shaft extending along a horizontal direction, and a tip end portion provided with the fall prevention member;
a second rotary member including a base end portion supported so as to be rotatable about a second rotation shaft extending along a vertical direction, and a tip end portion to which the first rotary member is attached; and
a stopper provided on the second rotary member;
the first rotary member rotates between a first state and a second state in which the tip end portion of the first rotary member is lifted higher than in the first state;
the fall prevention member advances to the space below the transport object in the second state; and
the stopper restricts rotation of the first rotary member when a force is applied to the first rotary member in the second state.

2. The transport vehicle according to claim 1, wherein
the first rotary member includes a horizontal shaft extending along an axial direction of the first rotating shaft;
the tip end portion of the second rotary member includes a vertical shaft, and a slide member attached to the vertical shaft so as to be slidable along an axial direction of the vertical shaft; and
the slide member is attached to the horizontal shaft so as to be slidable along an axial direction of the horizontal shaft.

3. The transport vehicle according to claim 2, wherein the slide member is attached to the horizontal shaft, through a slide plate that includes an elongated hole with a longitudinal direction is a vertical direction and a spherical plain bearing.

4. The transport vehicle according to claim 1, wherein
when the first rotary member is rotated from the first state to the second state, the second rotary member is in a state in which the second rotary member is rotated in one direction until the tip end portion of the second rotary member is in a position past a dead point.

5. The transport vehicle according to claim 1, wherein
the fall prevention mechanism has an elastic member that generates a moment in a direction of rotating the first rotary member from the first state to the second state.

* * * * *